United States Patent [19]
Menezes

[11] Patent Number: 6,084,444
[45] Date of Patent: Jul. 4, 2000

[54] BUFFER DRIVER REFERENCE CIRCUIT

[75] Inventor: Vinod J. Menezes, Bangalore, India

[73] Assignee: Texas Instruments Incorporated, Dallas, Tex.

[21] Appl. No.: 09/065,011

[22] Filed: Apr. 23, 1998

Related U.S. Application Data

[60] Provisional application No. 60/045,194, Apr. 30, 1997.
[51] Int. Cl.[7] .................................................. H03B 1/00
[52] U.S. Cl. ................................ 327/112; 326/27; 326/83
[58] Field of Search ........................... 326/26, 27, 82, 326/83, 87, 23; 327/108, 112

[56] References Cited

U.S. PATENT DOCUMENTS

| | | | |
|---|---|---|---|
| 5,389,834 | 2/1995 | Kinugasa et al. | 326/21 |
| 5,736,888 | 4/1998 | Sharpe-Geisler | 327/382 |
| 5,877,647 | 3/1999 | Vajapey et al. | 327/391 |
| 5,929,664 | 7/1999 | Alleven | 327/108 |

*Primary Examiner*—Tuan T. Lam
*Attorney, Agent, or Firm*—Robert N. Rountree; Robby T. Holland; Frederick J. Telecky, Jr.

[57] ABSTRACT

A circuit for charging or discharging a capacitive load. The circuit includes a buffer driver comprising first and second input terminals and an output terminal, and a reference voltage generator coupled to the buffer driver. The reference voltage generator includes an enablement signal terminal, first and second reference voltage terminals, and a circuit operable to provide first and second reference voltages at the first and second reference voltage terminals in response to a first signal at the enablement terminal. The reference voltage generator also provides first and second rail voltages in response to a second signal at the enablement terminal.

15 Claims, 6 Drawing Sheets

BUFFER DRIVER REFERENCE CIRCUIT

This application claims priority under 35 U.S.C. § 119 (e)(1) of provisional application number 60/045,194, filed Apr. 30, 1997.

FIELD OF THE INVENTION

This invention generally relates to semiconductor integrated circuits, and more specifically to output buffer driver circuits.

BACKGROUND OF THE INVENTION

Figure 1:
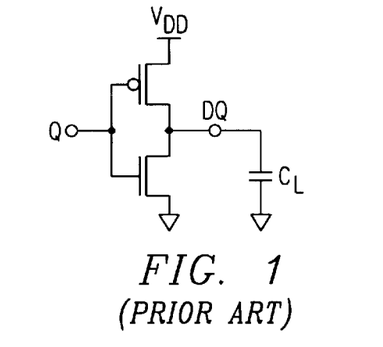
FIG. 1 is a schematic diagram of a prior art output buffer driver.
Figure 2:
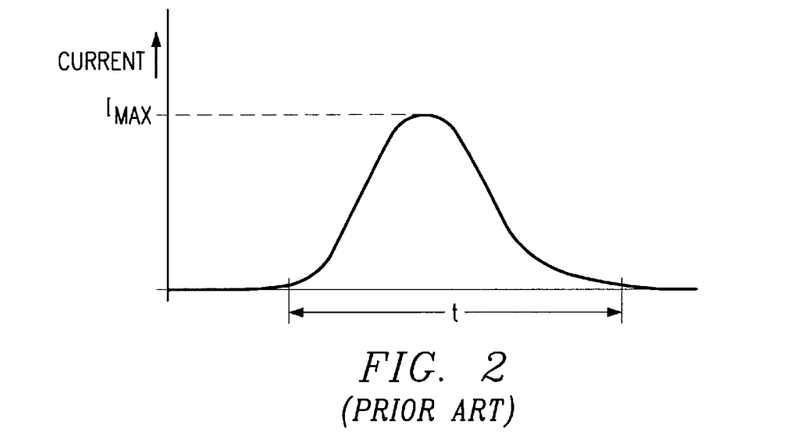
FIG. 2 is a plot of the discharge characteristics of the circuit of FIG. 1.

The interface between an integrated circuit and external circuitry is commonly a large complementary metal-oxide-semiconductor (CMOS) inverter as shown in FIG. 1. This circuit, known as an output driver or output buffer driver, drives a capacitive load, $C_L$, that may comprise a data bus and circuits attached thereto. The design of the output driver is constrained by the requirement that it charge and discharge the load capacitance quickly enough to transmit a signal within a short time, but not so short a time as to generate a current spike that may upset the performance of circuits sharing the same bus as the output driver. Assuming that the load capacitance is charged to power supply voltage level VDD, and the load is discharged by the output driver through inductance L, which may include package and bus inductance, the noise voltage generated is LdI(t)/dt. Hence, the noise generated by the driver is proportional to the slope of the curve (the slew rate) that describes the discharge current of the capacitive load. A typical discharge current curve is shown in FIG. 2. A discharge curve with a steep slope generates more noise than for a shallow slope, but a discharge with a shallow slope requires more time for completion. The rate at which the output driver functions is thus a tradeoff between the increased noise of a rapidly charged or discharged load and the slower signal transmission of a slowly charged or discharged load.

It is also desirable that the output driver provide alternative modes of operation, such as standby or sleep modes. In the standby mode of operation for a flash memory output circuit, for example, the output driver is disabled (tri-stated) and the output data bus is not driven. In standby mode the output driver should consume as little current as possible. In the sleep mode, the output driver is designed to draw little current, but the data bus is still driven with the data corresponding to the last address requested by the user. The sleep mode is entered after a certain period of time elapses after the last address request. Thus, not only must the output driver be designed to operate at a given slew rate in its active mode, but also to provide very low power modes as well.

Past efforts at controlling the charge or discharge rate of an output driver have relied on a reference voltage generator to control the rate at which the driver is driven to either a logic high or a logic low. These circuits typically consume significant current in both the active and standby modes in order to ensure that the output settles quickly to its final level after the transition of the circuit from the standby state to the active state. The high current consumption is due to the use of high-impedance bleeder circuits, which consume current to maintain the reference level close to the desired level. See, e.g. U.S. Pat. No. 4,614,882 to parker et al., U.S. Pat. No. 5,300,828 to McClure, and U.S. Pat. No. 5,489,862 to Risinger et al. Current is also consumed in circuits designed to maintain intermediate nodes within the output circuit at voltage levels close to the active-state levels when the circuit is in standby mode.

SUMMARY OF THE INVENTION

In accordance with a preferred embodiment of the invention, there is disclosed a circuit for charging or discharging a capacitive load. The circuit includes a buffer driver comprising first and second input terminals and an output terminal, and a reference voltage generator coupled to the buffer driver. The reference voltage generator includes an enablement signal terminal, first and second reference voltage terminals, and a circuit operable to provide first and second reference voltages at the first and second reference voltage terminals in response to a first signal at the enablement terminal. The reference voltage generator also provides first and second supply voltages in response to a second signal at the enablement terminal.

An advantage of the inventive concepts is that the voltage reference generator consumes essentially no current in the sleep and standby modes, and is still capable of providing drive voltages in the sleep mode. In addition, the sleep and standby performance enhancements are gained at no expense to the ability of the reference voltage generator to quickly and accurately provide the desired voltages to an output buffer driver. The disclosed circuits are simple and occupy relatively little space on a semiconductor die.

BRIEF DESCRIPTION OF THE DRAWINGS

The foregoing features of the present invention may be more fully understood from the following detailed description, read in conjunction with the accompanying drawings, wherein.

DETAILED DESCRIPTION OF PREFERRED EMBODIMENTS

Figure 3:
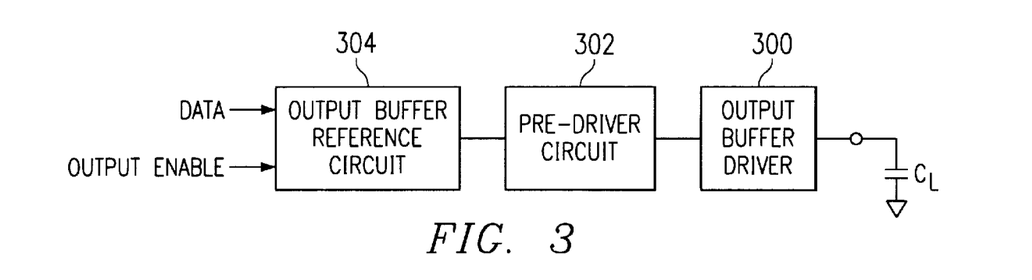
FIG. 3 is a generalized block diagram of an output circuit for a flash memory circuit.

FIG. 3 is a generalized block diagram of an output circuit, such as may be used to drive an output terminal of a flash memory circuit, for example. Output buffer driver 300 can include the circuit shown in FIG. 1, or alternatively a functional equivalent including bipolar transistors, for example. Pre-driver circuit 302 accepts data and reference voltage signals from the output buffer reference circuit 304 and sets the control input voltages on the inputs to the output driver 300 in accordance with the reference voltage signals.

Figure 4:
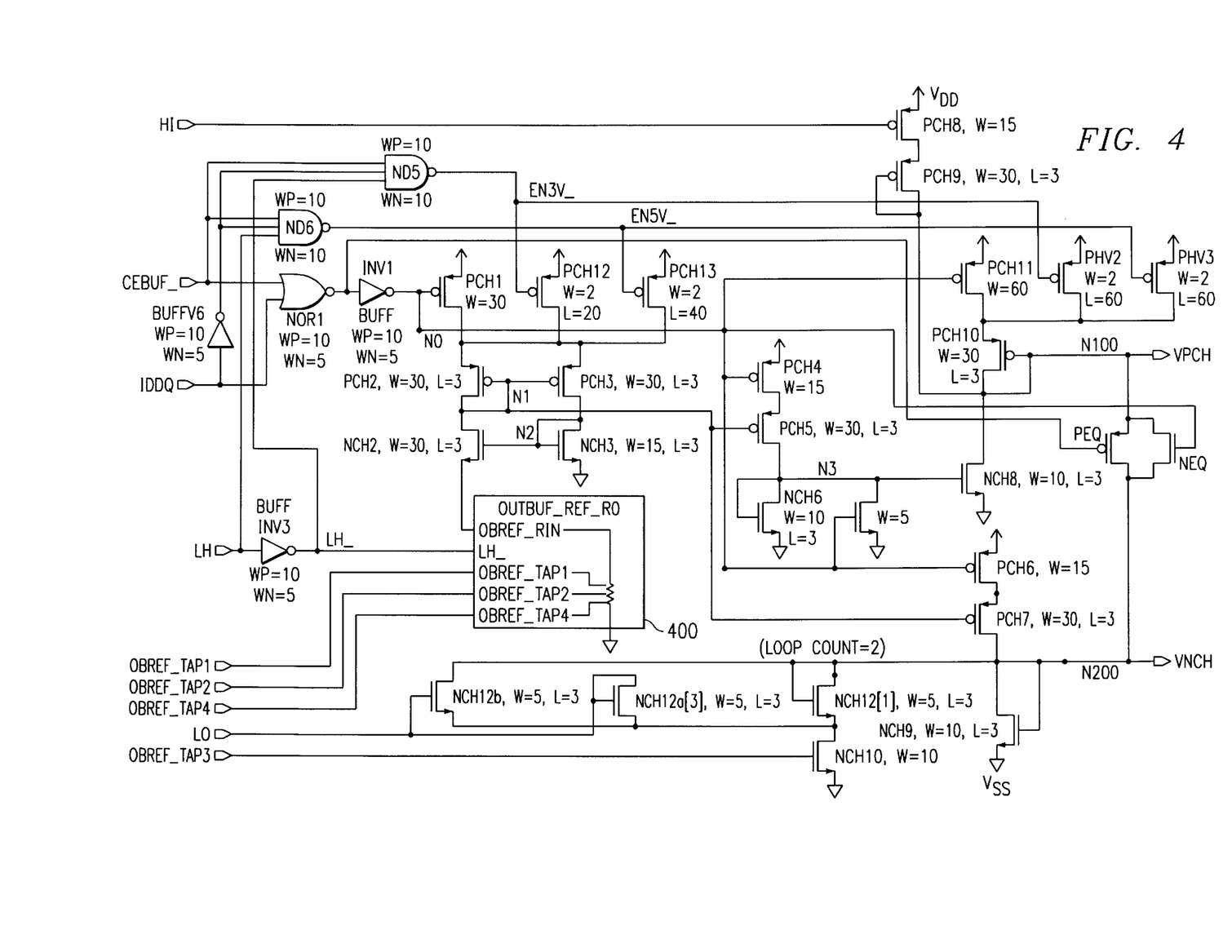
FIG. 4 is a schematic diagram of a reference voltage generator incorporating bleeder transistor bias networks.

The circuit shown in FIG. 4 is an example of an output buffer reference circuit that incorporates resistive bleeder transistors to set node voltages and reference voltages when the circuit is in standby mode. This circuit consumes approximately 1 mA when in its active state and about 4 µA in the standby and sleep modes. The outputs VPCH and VNCH are the reference voltages that are sent to pre-driver circuitry to control the di/dt characteristics of an output buffer driver. The terminals of the circuit at which these voltages appear are also referred to as VPCH and VNCH in the discussion that follows.

CEBUF_ is an output enable signal that is a logic high when the circuit is in standby mode. HI is connected to VCC and thus is a logic high, and LO is connected to electrical ground and thus is a logic low. IDDQ is an enable signal for a special test mode, and in normal operation is a logic low. LH is a signal indicating that the circuit has been selected to operate in either a 5 Volt mode or 3.3 Volt mode. In this embodiment, a logic low LH signal indicates 3.3 Volt operation, while a logic high indicates the 5 Volt mode. The choice of supply voltage affects the biasing of the output buffer reference. In 5 Volt mode more resistance is included in the reference circuit to reduce current and to set bias levels based on the new VCC. Transistors PCH12, PCH13, PHV2, and PHV3 are bleeder transistors that provide a small current to nodes within the circuit and ensure that terminals VPCH and VNCH remain at a diode voltage drop above VSS (electrical ground in this embodiment). The VPCH and VNCH terminals are connected by pass transistors PEQ and NEQ and are held at the voltage drop across the diode-connected transistor NCH9 in the standby mode. With CEBUF_ a logic high and IDDQ a logic low, the outputs of NAND gates ND5 and ND6 are in opposite logic states depending on the LH signal. Therefore, changing the state of signal LH selects between two sets of bleeder transistors: PCH12 and PHV2, or PCH13 and PHV3. The bias voltages may be further set through the choice of tap on variable-tap resistor 400. The appropriate tap is selected through circuit simulations to optimize the circuit to the current manufacturing process.

Thus, the circuit of FIG. 4 provides a standby reference voltage at the terminals VPCH and VNCH. One drawback, of course, is that the circuit consumes current in performing this function. Another problem is that in the standby mode, VPCH and VNCH are held only at the voltage drop across diode-connected transistor NCH9. Thus, the circuit is unable to provide CMOS supply voltages to the load after the circuit has been addressed and after the lapse of a set period of time after which the circuit goes into its low current mode (sleep mode).

Figure 5:
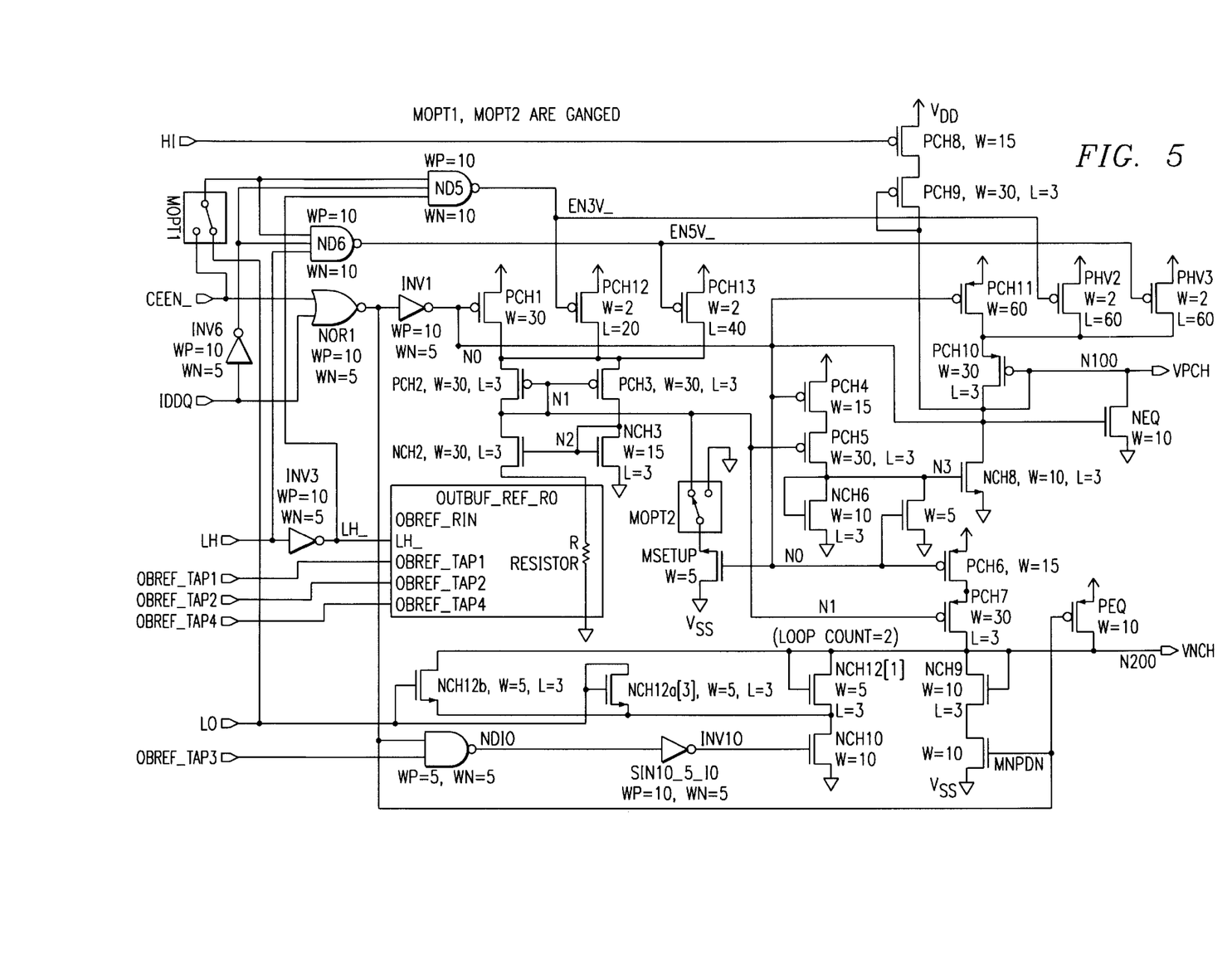
FIG. 5 is a schematic diagram of a first preferred embodiment reference voltage generator.

In a first preferred embodiment of the invention, shown in FIG. 5, the circuit of FIG. 4 is modified so that it consumes no current in standby or sleep mode. This improvement is accomplished while still providing for a tri-stated buffer output in standby mode and for VNCH and VPCH to be at VCC and VSS, respectively, in the sleep mode of the circuit. In addition to providing no current draw in standby and sleep modes, the circuit settles VNCH and VPCH to the desired levels quickly and without additional delay over the circuit shown in FIG. 4. The improvements also reduce circuit complexity and make for a circuit layout that consumes less semiconductor area.

A comparison of the circuits shown in FIGS. 4 and 5 reveals the addition in FIG. 5 of the metal-layer switches MOPT1 and MOPT2. The switches allow the choice between the no-current first preferred embodiment version of the buffer reference circuit, or a circuit that incorporates bleeder transistors as in the circuit of FIG. 4. The circuit of FIG. 5 also includes the additional transistor MSETUP between node N1 and VSS (ground). Further, the connection of nodes N100 and N200 in the circuit of FIG. 4 via transistors PEQ and NEQ is eliminated in the circuit of FIG. 5. NAND gate ND10 and inverter INV10 were added to ensure that transistor NCH10 is inactive in the sleep and standby modes even if the signal OBREF_TAP3 is high. The effects of these modifications on circuit performance are described below.

Figure 6:
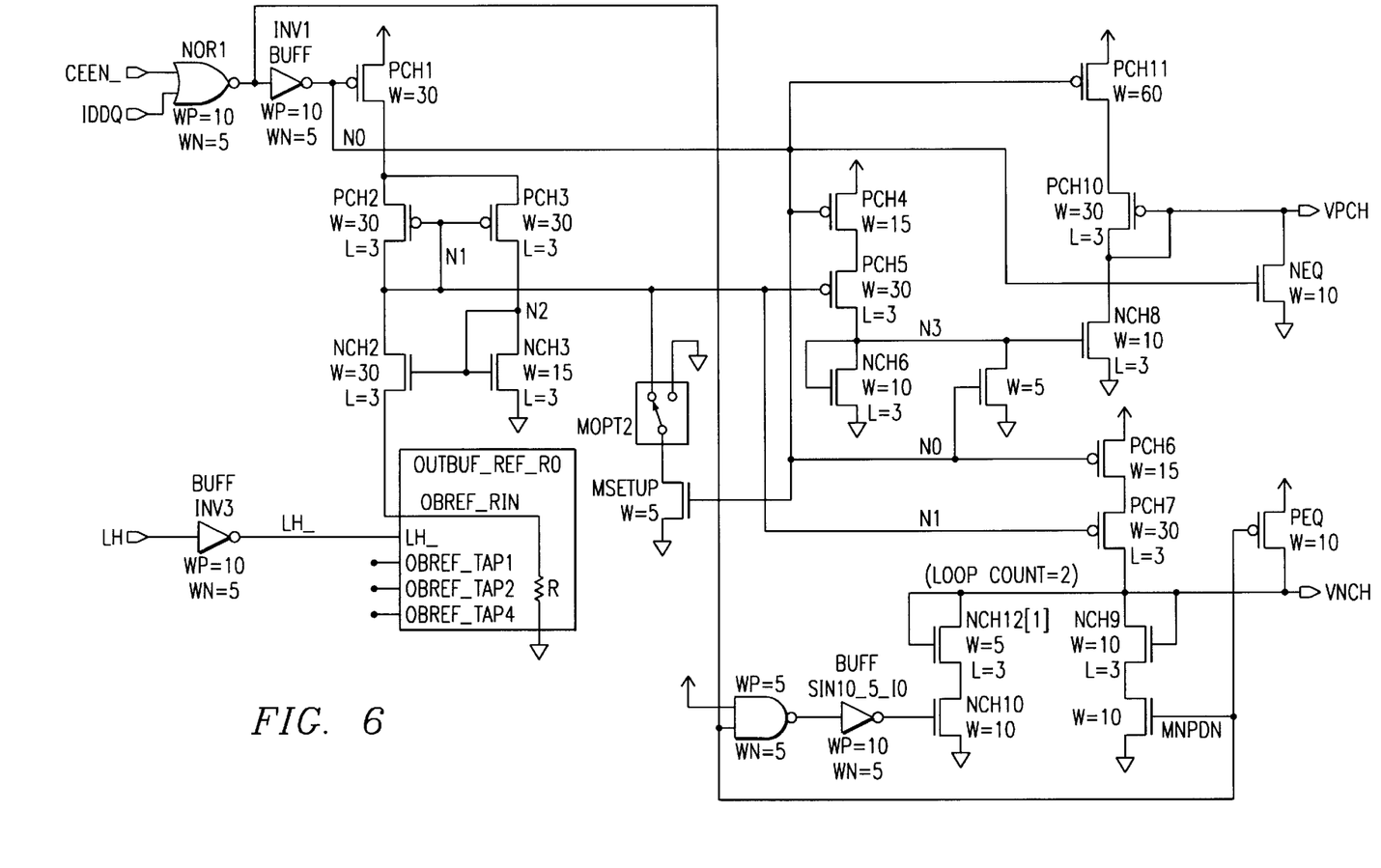
FIG. 6 is a schematic diagram of a second preferred embodiment reference voltage generator.

The circuit of FIG. 6 is a second preferred embodiment of the buffer reference generator circuit. It is the functional equivalent of the circuit of FIG. 5 with the metal switches MOPT1 and MOPT2 in the positions shown in FIG. 5. In the circuit of FIG. 6, the metal-layer switches and the extraneous bleeder transistors are removed to conserve semiconductor die area.

Figure 7:
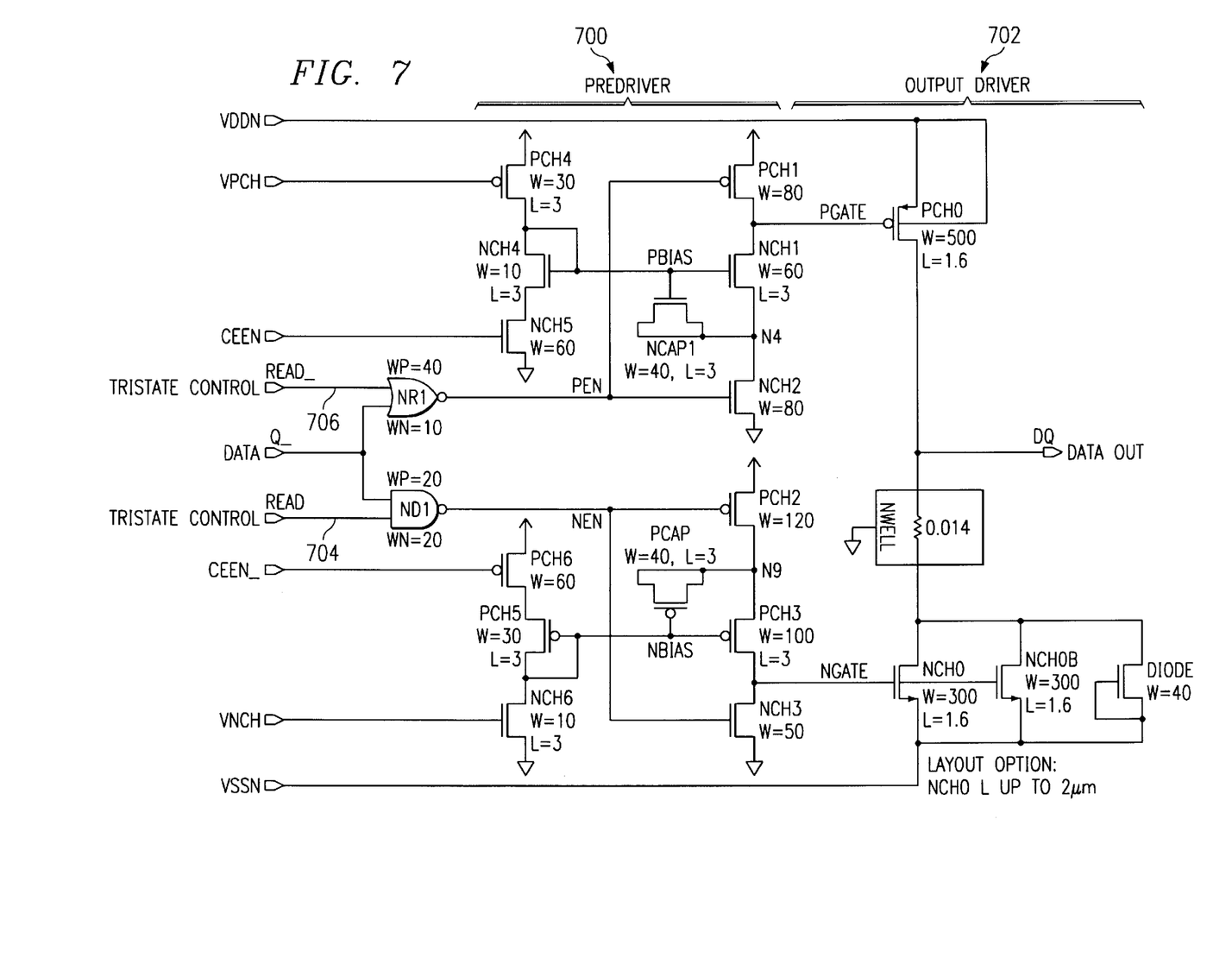
FIG. 7 is schematic diagram of a predriver and output driver circuit that may be biased by the circuits of FIGS. 5 or 6.

As discussed above, one of the functions of an output buffer reference generator circuit is to provide the two voltages VNCH and VPCH that are fed to the output buffer pre-driver 700 and eventually to the output driver 702 shown in FIG. 7. These reference voltages are responsible for biasing the pre-driver and driver circuits to prevent the rate of charge or discharge of a capacitive load (such as a data bus) at the output of the buffer from exceeding a threshold beyond which excessive noise is generated. In the circuits of FIGS. 5, 6, and 7, the control enable signal CEEN_ is used to enable or disable the buffer. When CEEN_ is a logic low, the output buffer is enabled, node N0 is a logic low, and transistors NEQ and PEQ are in a nonconductive state (off). Therefore, in the embodiment circuits of FIGS. 5 and 6, the reference voltage VNCH is VTN+delta1, where VTN is the drop in voltage across a diode-connected n-channel transistor (transistors NCH12 and NCH9), and delta1 is an incremental voltage sufficient to keep the input transistors of the pre-driver stage out of the subthreshold region of operation. The nominal value for VTN in this embodiment is approximately 0.5 Volts and delta 1 is in the range of approximately 0.05 to 0.1 Volts. The reference voltage VPCH is VCC-VTPdelta-2, where VCC is of course the supply voltage, VTP is the drop in voltage across a diode-coupled p-channel transistor (transistor PCH10), and delta2 is similar to delta1; that is, an incremental voltage sufficient to keep the input transistors of the pre-driver stage out of the subthreshold region of operation. The nominal value for VTP is approximately 1.0 Volts and delta2 is comparable to delta1.

When CEEN_ is a logic high, node N0 is a logic high and transistors NEQ and PEQ are in a conductive state (on). VPCH is forced to ground (VSS) and VNCH is pulled to the supply voltage (VCC). In this state, all of the current paths in the reference circuit are off and the standby and sleep current is thus zero. Because VPCH and VNCH are at the CMOS supply voltages in this mode, the output buffer can optionally be driven (sleep mode) or put into its high-impedance tri-state condition (standby mode). The selection between sleep and standby modes is made by the READ and READ_ signal inputs 704 and 706 directly to the pre-driver/driver circuit shown in FIG. 7. Specifically, the standby mode is achieved by providing a READ signal that is a logic low (and the READ_ signal is a logic high). Node PEN is therefore a logic low and node NEN is a logic high. The signal at node PGATE is thus a logic high and the signal at node NGATE is a logic low, since transistors PCH1 and NCH2 form one inverter and transistors PCH2 and NCH3 form a second inverter. The high logic voltage at the gate of the p-channel transistor PCH0 of the output driver and the low logic voltage at the gate of the n-channel transistor NCH0 (and NCH0b) turn both transistors off and therefore present a high-impedance (tri-state condition) to a circuit connected to the DQ pad.

The standby and sleep modes differ in that when the standby mode is selected, the output circuit is disabled. The output driver is tri-stated to prevent loading of the output bus, for example, to which it is connected. In contrast, in sleep mode the output circuit may have recently been addressed or placed in its active state, but the user has since failed to make a new access (by changing the address, for example). A flash memory integrated circuit, for example, includes circuitry to detect such inactive periods and places the output circuit into sleep mode. Since the user still expects data to be provided at the output for the specified address in this mode, it is desirable that the circuit continue to drive the data bus with the data from the addressed memory location. But since the output is already being driven, it is not necessary that the output buffer reference generator be active to prevent charging or discharging of the load capacitance at a rate sufficient to cause excessive bus noise. Thus, in both the standby and sleep modes, it is desirable that the output buffer reference generator circuit consume as little current as possible. The embodiment circuits actually eliminate current consumption.

The transistor MSETUP in the circuits of FIGS. 5 and 6 increases the turn-on speed of the circuit. Without MSETUP node N1 charges very slowly to its final level. Indeed, the node charges so slowly that a number of data access attempts could be made by the user before the node fully charges. Such a situation could result in incorrect data being driven at the output and in the ringing that the reference generator circuit is intended to prevent. A case in point is the circuit of FIG. 4, which lacks the transistor MSETUP or equivalent. In that circuit the transistors PEQ and NEQ are turned off immediately when the circuit is put into active mode (CEBUF_ is a logic low). Node N1, however, is very slow to charge, and as a result VPCH is weakly pulled down toward VCC-VTP. VNCH is similarly weakly pulled up to VTN. This slow and weak response causes the output buffer pre-driver 700 transistors PCH4 and NCH6 to turn off. Nodes PBIAS and NBIAS therefore tend to float, making the performance of output driver 702 unreliable.

In contrast, the circuits of FIGS. 5 and 6 rely on MSETUP to initialize node N1 to VSS (ground). In this embodiment, the initialization is done only in the standby mode. By initializing node N1 to ground, the transistors PCH2, PCH5, and PCH7 are biased to turn on strongly. Therefore, when the circuit is switched from standby or sleep mode to the active mode, the VNCH terminal has a pull up current path via PCH7 to counter the pull down of NCH9. Similarly, the transistor PCH5 biases node N3 faster, and as a result transistor NCH8 turns on to counter the pull-up caused by transistor PCH11. The ultimate result is that both the VNCH and VPCH terminals settle to their final voltages quickly. One of the reasons that conventional buffer reference circuits consume standby power is to ensure that the output settles to its final level as soon as possible when the circuit is switched from its standby state to the active state. In contrast, in the embodiment circuits of FIGS. 5 and 6, the standby current in the standby and sleep modes is kept at zero and the output buffer is still capable of driving a load (in the sleep mode), all with little or no impact on the speed of the output buffer driver 702.

Figure 8:
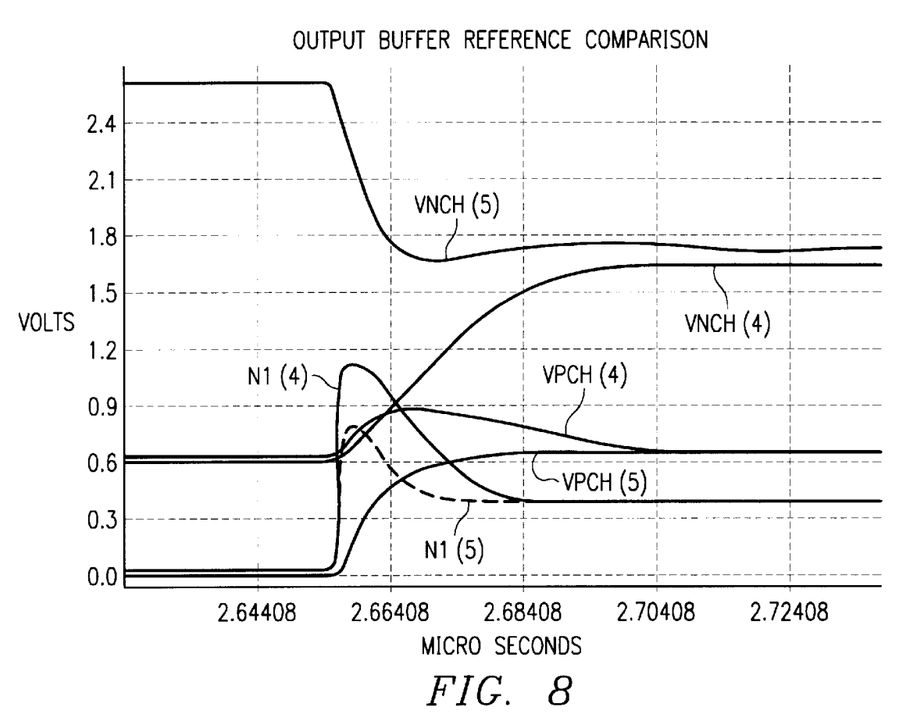
FIG. 8 is a plot of reference voltages as a function of time after the reference circuit of FIGS. 5 or 6 is enabled.

FIG. 8 is a plot of the reference voltages VNCH and VPCH as a function of time after the reference circuit is enabled. The traces labeled VNCH(4) and VPCH(4) correspond to the circuit of FIG. 4, while the traces labeled VNCH(5) and VPCH(5) correspond to the circuit of FIG. 5. The relatively fast settling time of the circuit of FIG. 5 is evident. Also shown in FIG. 8 are the node N1 voltages for the circuits of FIGS. 4 and 5. The advantage of the FIG. 5 circuit in terms of settling time with respect to that node is also clear.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. A circuit for driving a load, comprising:
   a buffer driver comprising first and second reference terminals and an output terminal, the load coupled to the output terminal; and
   a reference voltage generator coupled to said buffer driver, said reference voltage generator comprising an enablement signal terminal and a circuit operable to provide first and second reference voltages at said first and second reference terminals, said first and second reference voltages having respective values intermediate said first and second supply voltages in response to a first signal at said enablement terminal, and said first and second reference voltages having respective values equal to said first and second supply voltages in response to a second signal at said enablement terminal.

2. The circuit of claim 1, wherein said buffer driver comprises a pull-up transistor coupled between said first supply voltage and said output terminal, and a pull-down transistor coupled between said output terminal and said second supply voltage.

3. The circuit of claim 1, wherein said circuit operable to provide first and second reference voltages comprises: a pull-down transistor coupled between said first reference voltage terminal and a terminal providing said second supply voltage, and a pull-up transistor coupled between said second reference voltage terminal and a terminal providing said first supply voltage.

4. The circuit of claim 3, wherein said circuit operable to provide first and second reference voltages further comprises: a first diode coupled between said terminal providing said first supply voltage and said first reference voltage terminal, and a second diode coupled between said second reference voltage terminal and said terminal providing said second supply voltage.

5. A circuit, comprising:
   a first supply voltage terminal arranged to produce a first supply voltage;
   a second supply voltage terminal arranged to produce a second supply voltage different from the first supply voltage;
   a reference circuit coupled to the first and second supply voltage terminals, the reference circuit having a first reference terminal and a first input terminal, the reference circuit arranged to produce a first reference voltage having a value intermediate the first and second supply voltages at the first reference terminal in response to a first signal at the first input terminal, the reference circuit arranged to produce the first reference voltage having a value equal to one of the first and second supply voltages at the first reference terminal in response to a second signal at the first input terminal; and
   an output circuit having an output terminal, the output circuit coupled to the first reference terminal.

6. A circuit as in claim 5, wherein the reference circuit further comprises a second reference terminal, the reference circuit arranged to produce a second reference voltage having a value intermediate the first and second supply voltages at the second reference terminal in response to the first signal at the first input terminal, the reference circuit arranged to produce the second reference voltage having a value equal to the other of the first and second supply voltages at the second reference terminal in response to the second signal at the first input terminal.

7. A circuit as in claim 5, wherein the reference circuit further comprises a first transistor coupled between the first supply voltage terminal and the first reference terminal and a second transistor coupled between the second supply voltage terminal and the first reference terminal, wherein the first and second transistors conduct current between the first and second supply voltage terminals in response to the first signal, and wherein the first and second transistors do not conduct current between the first and second supply voltage terminals in response to the second signal.

8. A circuit as in claim 5, wherein the output circuit further comprises a data input terminal and a second input terminal, the data input terminal coupled to receive a data input signal, the output circuit arranged to produce an output signal at the output terminal corresponding to the data input signal in response to a third signal at the second input terminal, the output circuit arranged to produce a high impedance state at the output terminal in response to a fourth signal at the second input terminal.

9. A circuit as in claim 8, wherein the third signal has a first logic level and the fourth signal has a second logic level.

10. A circuit as in claim 6, wherein the output circuit further comprises:
a first output transistor having a drain terminal coupled to the output terminal and having a gate terminal;
a first delay circuit coupled between the first reference terminal and the gate of the first output transistor;
a second output transistor having a drain terminal coupled to the output terminal and having a gate terminal; and
a second delay circuit coupled between the second reference terminal and the gate of the second output transistor.

11. A circuit as in claim 6, wherein the first supply voltage is VCC, the second supply voltage is VSS, the first reference voltage is approximately VSS plus a transistor threshold voltage, and the second reference voltage is approximately VCC minus a transistor threshold voltage.

12. A method of producing a signal, comprising the steps of:
producing first and second supply voltages;
producing a first reference voltage having a first value intermediate the first and second supply voltages corresponding to a first mode of operation;
producing the first reference voltage having a second value equal to one of the first and second supply voltages corresponding to a second mode of operation;
applying the first reference voltage and a data input signal to an output circuit;
applying a control signal to the output circuit, the control signal having a first value corresponding to the first and second modes of operation, the control signal having a second value corresponding to a third mode of operation;
producing a data output signal corresponding to the data input signal in the first and second modes of operation; and
producing a high impedance data output signal in the third mode of operation.

13. A method as in claim 12, further comprising the steps of:
producing a second reference voltage having a third value intermediate the first and second supply voltages corresponding to the first mode of operation;
producing the second reference voltage having a fourth value equal to the other of the first and second supply voltages corresponding to the second mode of operation;
applying the second reference voltage to the output circuit.

14. A method as in claim 12, further comprising the steps of:
conducting current between the first supply voltage terminal and the second supply voltage terminal through first and second series-connected transistors in the first mode of operation;
producing the first reference voltage at a terminal between the first and second series-connected transistors; and
turning off at least one of the first and second series-connected transistors in the second mode of operation.

15. A method as in claim 12, wherein the step of producing a data output signal comprises the steps of turning on a first output transistor and turning off a second output transistor, and wherein the step of producing a high impedance data output signal comprises the step of turning off the first and the second output transistor.

* * * * *